US011605602B2

(12) United States Patent
Lise et al.

(10) Patent No.: US 11,605,602 B2
(45) Date of Patent: Mar. 14, 2023

(54) APPARATUS, SYSTEM, AND METHOD FOR INCREASED CURRENT DISTRIBUTION ON HIGH-DENSITY CIRCUIT BOARDS

(71) Applicant: Juniper Networks, Inc., Sunnyvale, CA (US)

(72) Inventors: Marshall J. Lise, Sunnyvale, CA (US); Anupama Padminidevi Karthikeyan Nair, Sunnyvale, CA (US); David K. Owen, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 442 days.

(21) Appl. No.: 16/835,640

(22) Filed: Mar. 31, 2020

(65) Prior Publication Data

US 2021/0219418 A1   Jul. 15, 2021

Related U.S. Application Data

(60) Provisional application No. 62/960,557, filed on Jan. 13, 2020.

(51) Int. Cl.
| | |
|---|---|
| *H01L 23/64* | (2006.01) |
| *H05K 1/16* | (2006.01) |
| *H01F 5/04* | (2006.01) |
| *H01F 27/06* | (2006.01) |
| *H01F 27/29* | (2006.01) |
| *H01F 17/04* | (2006.01) |
| *H01L 23/522* | (2006.01) |

(Continued)

(52) U.S. Cl.
CPC ............. *H01L 23/645* (2013.01); *H01F 5/04* (2013.01); *H01F 17/043* (2013.01); *H01F 27/06* (2013.01); *H01F 27/2828* (2013.01); *H01F 27/292* (2013.01); *H01L 23/5227* (2013.01); *H01L 28/10* (2013.01); *H05K 1/165* (2013.01); *H01F 2027/065* (2013.01)

(58) Field of Classification Search
CPC ... H01L 23/5227; H01L 23/645; H01L 28/10; H01F 5/04; H01F 17/043; H01F 27/06; H01F 27/2828; H01F 27/292; H01F 2027/065; H05K 1/165
See application file for complete search history.

(56) References Cited

U.S. PATENT DOCUMENTS

| | | | | |
|---|---|---|---|---|
| 5,241,133 A | * | 8/1993 | Mullen, III | ............. H01L 24/32 361/728 |
| 2010/0007453 A1 | * | 1/2010 | Yan | ......................... H01F 41/04 29/602.1 |

(Continued)

FOREIGN PATENT DOCUMENTS

| | | | | |
|---|---|---|---|---|
| JP | S55-133509 A | * | 10/1980 | ........... H01F 17/043 |
| JP | 2019129253 A | * | 8/2019 | ............... G01F 3/10 |

*Primary Examiner* — Herve-Louis Y Assouman
*Assistant Examiner* — Christopher M Roland
(74) *Attorney, Agent, or Firm* — Greenberg Traurig, LLP

(57) ABSTRACT

The disclosed current-distribution inductor may include (1) a magnetic core and (2) a conductor electrically coupled between a power source and an electrical component of a circuit board, wherein the conductor comprises (A) a bend that passes through the magnetic core and (B) a flying lead that extends from the bend to the electrical component of the circuit board and runs parallel with the circuit board. Various other apparatuses, systems, and methods are also disclosed.

18 Claims, 13 Drawing Sheets

(51) Int. Cl.
    *H01L 49/02*       (2006.01)
    *H01F 27/28*       (2006.01)

(56)             References Cited

U.S. PATENT DOCUMENTS

| | | | |
|---|---|---|---|
| 2012/0056703 A1* | 3/2012 | Ikriannikov | H01F 17/04 |
| | | | 336/188 |
| 2016/0300659 A1* | 10/2016 | Zhang | H05K 1/0263 |
| 2019/0214181 A1* | 7/2019 | Wang | H01F 3/14 |
| 2020/0211939 A1* | 7/2020 | Khanolkar | H01L 23/3107 |
| 2021/0358676 A1* | 11/2021 | Wang | H01F 27/341 |

* cited by examiner

APPARATUS, SYSTEM, AND METHOD FOR INCREASED CURRENT DISTRIBUTION ON HIGH-DENSITY CIRCUIT BOARDS

CROSS-REFERENCE TO RELATED APPLICATION

This application claims the benefit of priority under 35 U.S.C. § 119(e) of U.S. Provisional Application No. 62/960,557, filed Jan. 13, 2020, the contents of which are incorporated herein by reference in their entirety.

BACKGROUND

High-technology devices (such as network routers and/or switches) may necessitate and/or consume large amounts of power. Some conventional high-technology devices may include circuit boards whose power planes and/or layers are unable to carry and/or deliver enough electric current to power certain Application Specific Integrated Circuits (ASICs). Moreover, the increasing performance demands of such high-technology devices may necessitate additional traces throughout the circuit boards to carry and/or deliver certain signals to and from the ASICS.

Further complicating such high-technology matters, industry trends may be moving toward smaller and/or more compact form factors or packaging for such devices. As a result, real estate on such circuit boards may become increasingly limited and/or expensive. The instant disclosure, therefore, identifies and addresses a need for additional and improved apparatuses, systems, and methods for increased current distribution on high-density circuit boards.

SUMMARY

As will be described in greater detail below, the instant disclosure generally relates to apparatuses, systems, and methods for increased current distribution on high-density circuit boards. In one example, a current-distribution inductor for accomplishing such a task may include (1) a magnetic core and (2) a conductor electrically coupled between a power source and an electrical component of a circuit board, wherein the conductor comprises (A) a bend that passes through the magnetic core and (B) a flying lead that extends from the bend to the electrical component of the circuit board, wherein a majority portion of the flying lead runs parallel with the circuit board.

Similarly, a system for accomplishing such a task may include (1) a circuit board that includes an electrical component and (2) a current-distribution inductor that includes (A) a magnetic core and (B) a conductor electrically coupled between a power source and an electrical component of a circuit board, wherein the conductor comprises (A) a bend that passes through the magnetic core and (B) a flying lead that extends from the bend to the electrical component of the circuit board, wherein a majority portion of the flying lead runs parallel with the circuit board.

A corresponding method may include (1) assembling a current-distribution inductor by (A) forming a bend within a conductor, (B) encasing the bend with a magnetic core, and (C) forming a flying lead within conductor to extend from the bend toward an electrical component of a circuit board, and (2) electrically coupling the current-distribution inductor between a power source and the electrical component of the circuit board such that a majority portion of the flying lead and the circuit board are parallel to one another.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
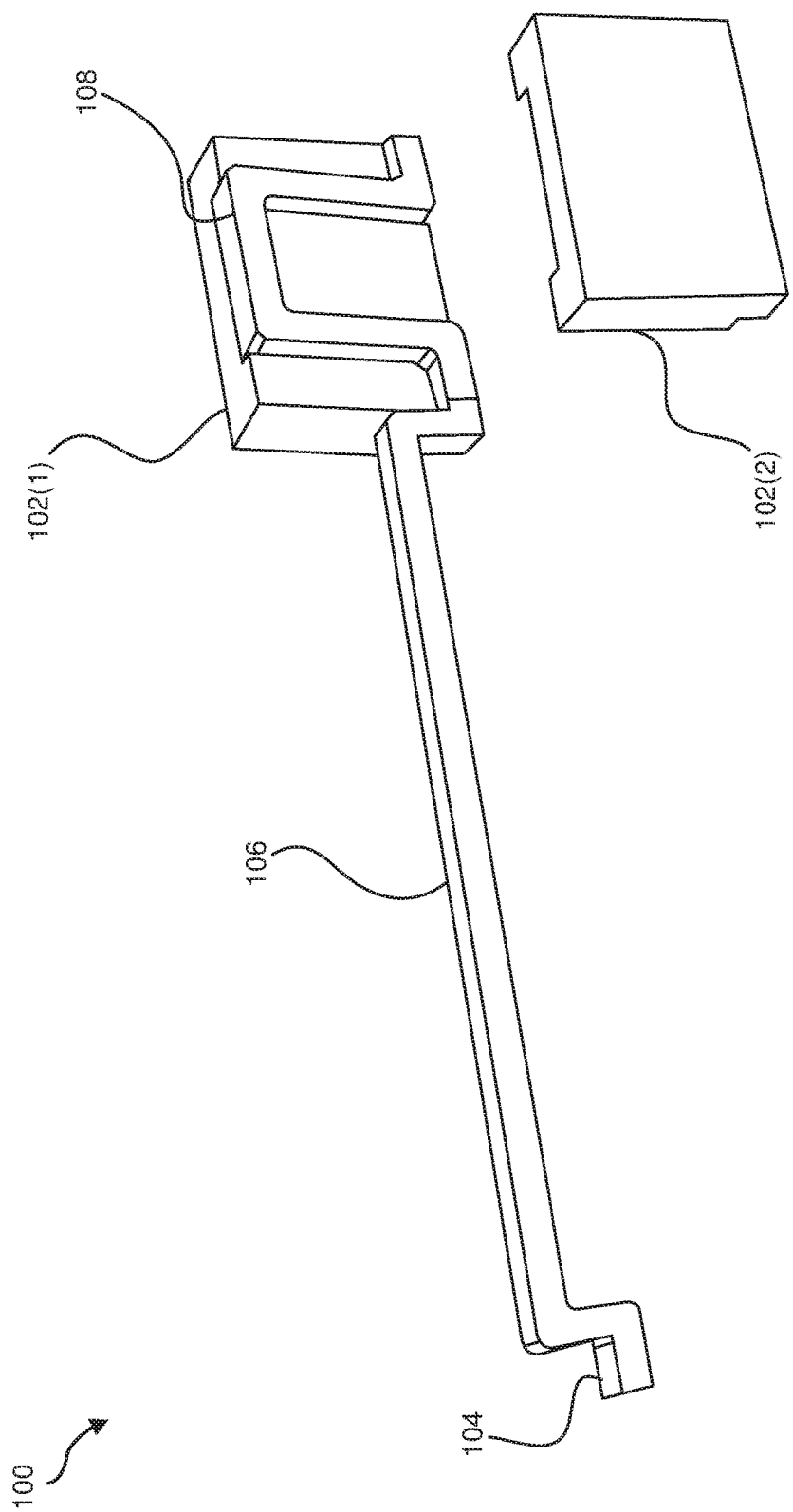
FIG. 1 is an illustration of an exemplary current-distribution inductor that facilitates increased current distribution on high-density circuit boards.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for increased current distribution on high-density circuit boards. As will be explained in greater detail below, embodiments of the instant disclosure may involve and/or constitute a current-distribution inductor that includes (1) a magnetic core and (2) a conductor electrically coupled between a power source and an electrical component of a circuit board, wherein the conductor comprises (A) a bend that passes through the magnetic core and (B) a flying lead that extends from the bend to the electrical component of the circuit board and runs parallel with the circuit board.

In some examples, a current-distribution system may incorporate and/or combine multiple modular instances of such an inductor. By incorporating and/or combining multiple modular instances in this way, the current-distribution system may be able to increase the amount of current capable of being carried and/or delivered to address and/or satisfy the power needs of the corresponding device and/or circuit board. This current-distribution system may provide various advantages and/or benefits over certain conventional systems. For example, even if the power planes and/or layers of a circuit board are unable to carry and/or deliver enough electric current to power an ASIC, this current-distribution system may be able to carry and/or deliver enough current to that ASIC via the flying leads of the system's modular inductors. In another example, even if the high-density design of a circuit board cannot accommodate enough power planes to carry and/or deliver the necessary amount of current to an ASIC, this current-distribution system may be able to carry and/or deliver enough current to that ASIC via the flying leads of the system's modular inductors.

The following will provide, with reference to FIG. 1-12, detailed descriptions of an exemplary apparatuses, systems, configurations, and/or implementations for increased current distribution on high-density circuit boards. In addition, the discussion corresponding to FIG. 13 will provide a detailed description of an exemplary method for increased current distribution on high-density circuit boards.

In some examples, an inductor may include and/or represent any type or form of electrical component that resists changes in the flow of electric current due to the component's inductance. In one example, inductance may include and/or represent any type or form of property or attribute that causes a conductor (in, e.g., an electrical component or circuit) to induce an electromotive force in response to a change in the flow of electric current. Examples of inductors include, without limitation, common-mode inductors, common-mode chokes, magnetic core inductors, ferromagnetic core inductors, laminated core inductors, toroidal inductors, coupled inductors, multi-layer inductors, steel core inductors, Radio Frequency (RF) inductors, power inductors, shielded inductors, wirewound inductors, switch-mode inductors, honeycomb coils, spiderweb coils, variations or combinations of one or more of the same, or any other suitable inductors.

Figure 2:
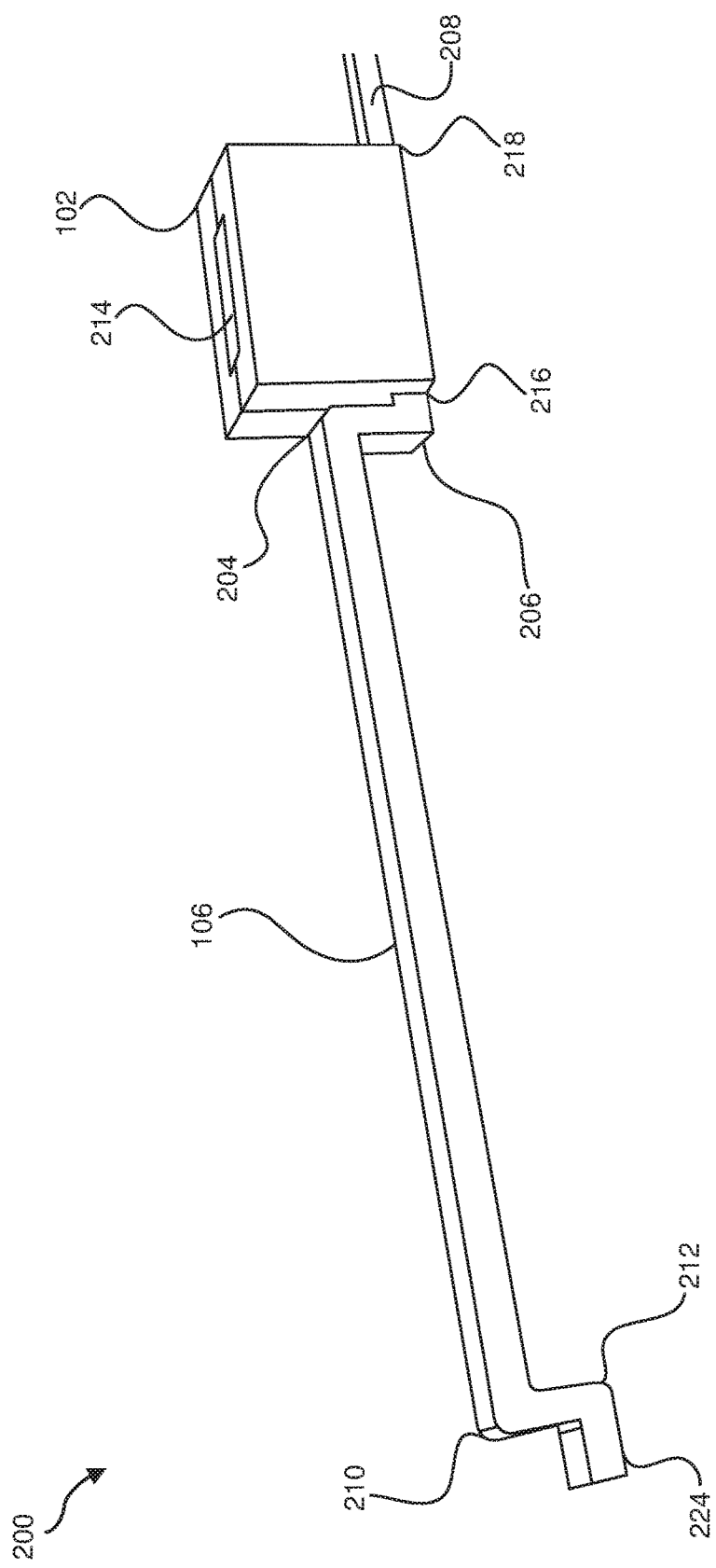
FIG. 2 is an illustration of an additional exemplary current-distribution inductor that facilitates increased current distribution on high-density circuit boards.

FIGS. 1 and 2 illustrates exemplary current-distribution inductors 100 and 200, respectively, for increased current distribution on high-density circuit boards. As illustrated in FIGS. 1 and 2, exemplary current-distribution inductors 100 and 200 may include and/or represent a conductor 104 that facilitates electrically coupling a power source and an electrical component (such as an ASIC, a solder pad, and/or an electrical via) of a circuit board to one another. In some examples, conductor 104 may include and/or incorporate a bend 108 that passes through a magnetic core 102. In one example, bend 108 may include and/or represent an inductive winding and/or coil.

As illustrated in FIGS. 1 and 2, current-distribution inductors 100 and 200 may include and/or represent a flying lead 106 intended and/or designed to extend from bend 108 to the electrical component of the circuit board. As will be described in greater detail below, a majority portion of flying lead 106 may run and/or be positioned parallel with the circuit board.

In some examples, conductor 104 may include and/or represent any type or form of conductive material. In one example, conductor 104 may include and/or represent a copper wire, lead, and/or structure. Examples of conductive materials include, without limitation, coppers, steels, alloys, silvers, nickels, aluminums, variations or combinations of one or more of the same, and/or any other suitable type of conductive materials.

In some examples, conductor 104 may be of any suitable shape and/or dimensions. Conductor 104 may include various bends, turns, levels (e.g., differing elevations), and/or segments. In one example, conductor 104 may include and/or form a bridge that rises above one or more features and/or components of the circuit board. In this example, conductor 104 may be able to carry and/or deliver electric current from the power source to the electrical component without interfering with and/or passing through the circuit board itself.

In some examples, conductor 104 may include and/or represent a single part and/or unit. For example, conductor 104 may constitute and/or represent a single piece of molded material and/or injection molding. In other examples, conductor 104 may include and/or represent an assembly of discrete parts or units. For example, a set of discrete parts or units may be coupled together by an attachment mechanism and/or fusion technique to form conductor 104.

In some examples, magnetic core 102 may include and/or represent any type or form of magnetic material. In one example, magnetic core 102 may include and/or represent ferrite and/or ferromagnetic materials. Examples of magnetic core 102 include, without limitation, ferromagnetic cores, iron cores, ferrite cores, steel cores, silicon steel cores, nickel cores, alloy cores, permalloy cores, variations or combinations of one or more of the same, and/or any other suitable type of magnetic core.

In some examples, magnetic core 102 may be of any suitable shape and/or dimensions. In one example, magnetic core 102 may include and/or represent a single part and/or unit. For example, magnetic core 102 in FIG. 2 may constitute and/or represent a single piece of molded material and/or injection molding. In other examples, magnetic core 102 may include and/or represent an assembly of discrete parts or units. For example, magnetic core 102 in FIG. 2 may include, represent, and/or be formed from magnetic core segments 102(1) and 102(2) in FIG. 1. In one example, magnetic core segments 102(1) and 102(2) in FIG. 1 may be adhered and/or combined to form or assemble a single unit that at least partially encompasses and/or encases bend 108 of conductor 104. In this example, when adhered and/or combined to one another, magnetic core segments 102(1) and 102(2) in FIG. 1 may be joined by an adhesive (e.g., silicones, glues, tapes, and/or sticky surfaces).

As illustrated in FIG. 2, conductor 104 may include and/or incorporate bends, turns, and/or levels (e.g., differing elevations). For example, flying lead 106 of conductor 104 may include and/or incorporate a bend 204, a bend 206, a bend 210, and a bend 212. In this example, conductor 104 may also include and/or incorporate a contact segment 224 designed and/or intended to make physical contact with a solder pad and/or an electrical via on the circuit board.

In one example, bend 204 and/or bend 206 of flying lead 106 may serve to elevate and/or raise flying lead 106 from the circuit board. In this example, bend 210 and/or bend 212 of flying lead 106 may serve to lower and/or descend the flying lead 106 to the circuit board. As a result, the majority portion of flying lead 106 may be elevated from and/or raised off the circuit board to any suitable level. For example, the majority portion of flying lead 106 may be elevated and/or raised to the same level as the top of magnetic core 102. Alternatively, the majority portion of flying lead 106 may be elevated and/or raised to the same level as the midpoint or middle of magnetic core 102. The majority portion of flying lead 106 may run and/or be positioned parallel to the circuit board.

In one example, conductor 104 may include and/or incorporate an entry segment 208 that enters a conductor entrance 218 on one side of magnetic core 102. In this example, conductor entrance 218 may be located and/or formed along a bottom corner of that side of magnetic core 102.

In one example, conductor 104 may also include and/or incorporate an exit segment that exits a conductor exit 216 on the opposite side of magnetic core 102. In this example, conductor exit 216 may be located and/or formed along a bottom corner of that opposite side of magnetic core 102. Further, magnetic core 102 may include and/or form an aperture 214 on its top side.

Figure 3:
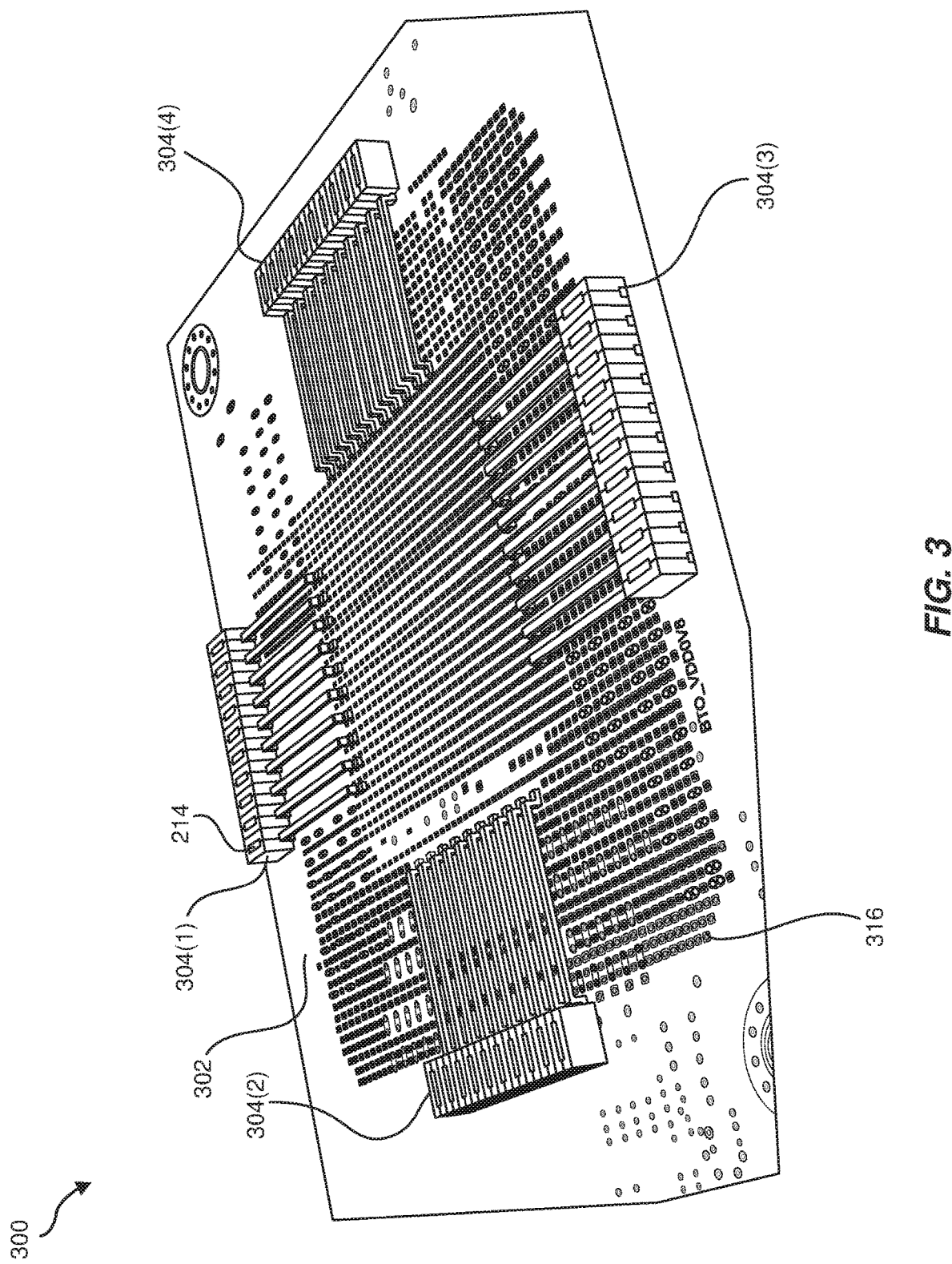
FIG. 3 is an illustration of an exemplary system that facilitates increased current distribution on high-density circuit boards.

FIG. 3 illustrates an exemplary system 300 for increased current distribution on high-density circuit boards. As illustrated in FIG. 3, exemplary system 300 may include and/or represent an array of inductors 304(1), an array of inductors 304(2), an array of inductors 304(3), and an array of inductors 304(4) coupled to a circuit board 302. In one example, each of these arrays may include and/or represent a set of current-distribution inductors 100. In this example, by deploying and/or implementing these arrays in this way, system 300 may provide and/or facilitate the carrying and/or delivery of enough current to power an ASIC via the flying leads of the individual inductors. In one embodiment, these arrays of inductors may be formed and/or created by joining and/or adhering the magnetic cores of individual current inductors together by an adhesive.

In some examples, these arrays of inductors may be coupled to one side of circuit board 302. In one example, these arrays of inductors may carry and/or deliver electric current to a power-consuming device (not illustrated in FIG. 3) coupled to the opposite side of circuit board 302. For example, an ASIC may be coupled to and/or deployed on the top side of circuit board 302, and these arrays of inductors may be coupled to and/or deployed on the bottom side of circuit board 302. In this example, the flying leads of these inductors may be electrically coupled to solder pads on the bottom side of circuit board 302.

In one example, these solder pads may each be electrically coupled to the top side of circuit board 302 by way of an electrical via (similar to electrical via 316 in FIG. 3). In this example, these electrical vias may carry and/or deliver electric current from the bottom side of circuit board 302 to the top side of circuit board 302. On the top side of circuit board 302, the electric current may traverse toward and/or reach the ASIC on circuit board 302.

As illustrated in FIG. 3, the flying leads of the inductors may be elevated from and/or raised off circuit board 302. For example, a majority portion of each flying lead may be elevated and/or raised off circuit board 302. In this example, the majority portion of each flying lead may avoid physical contact with circuit board 302. By doing so, each flying lead may be able to jump and/or pass over certain features and/or components placed between the magnetic core and the contact segment on circuit board 302.

Figure 4:
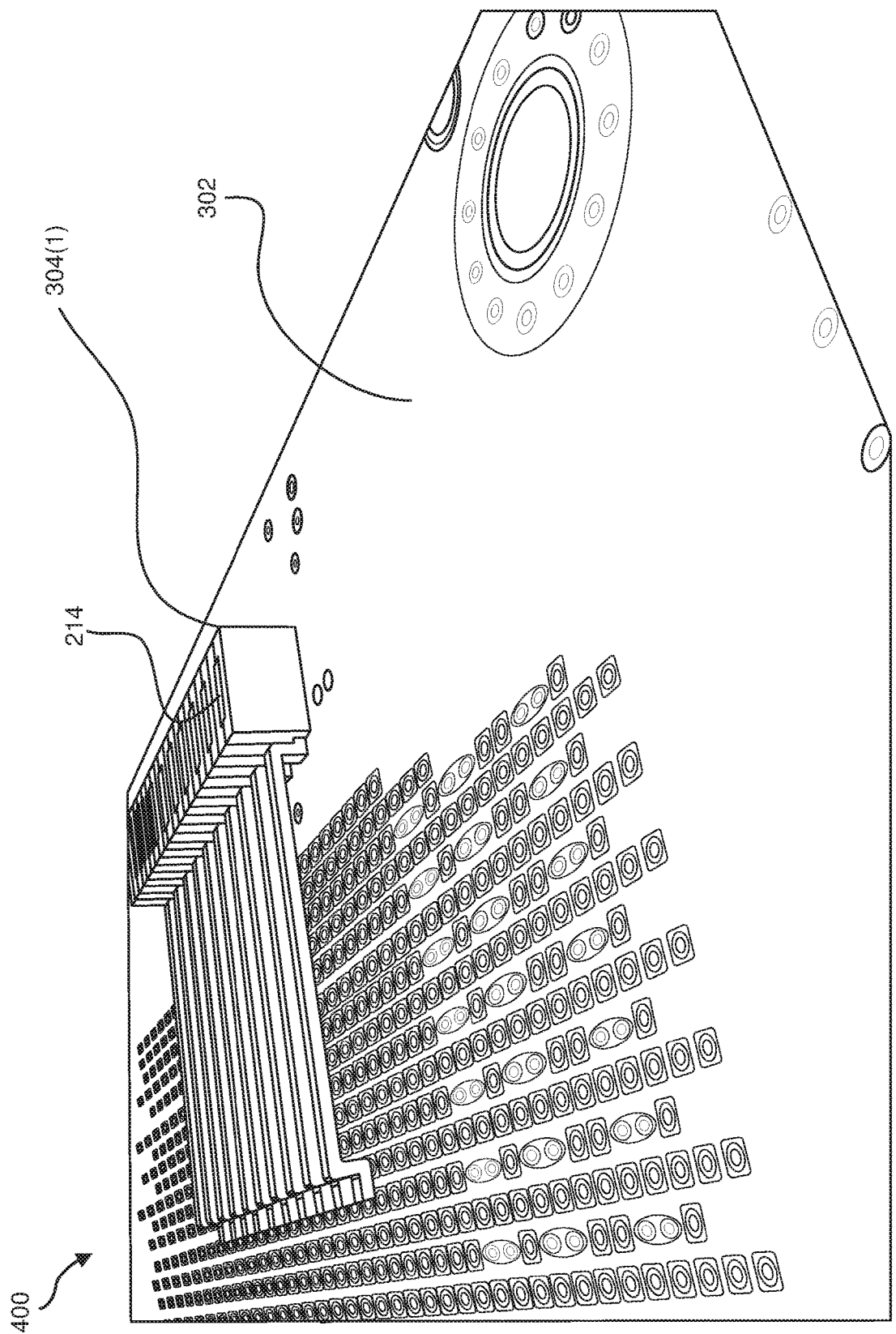
FIG. 4 is an illustration of an additional exemplary system that facilitates increased current distribution on high-density circuit boards.
Figure 5:
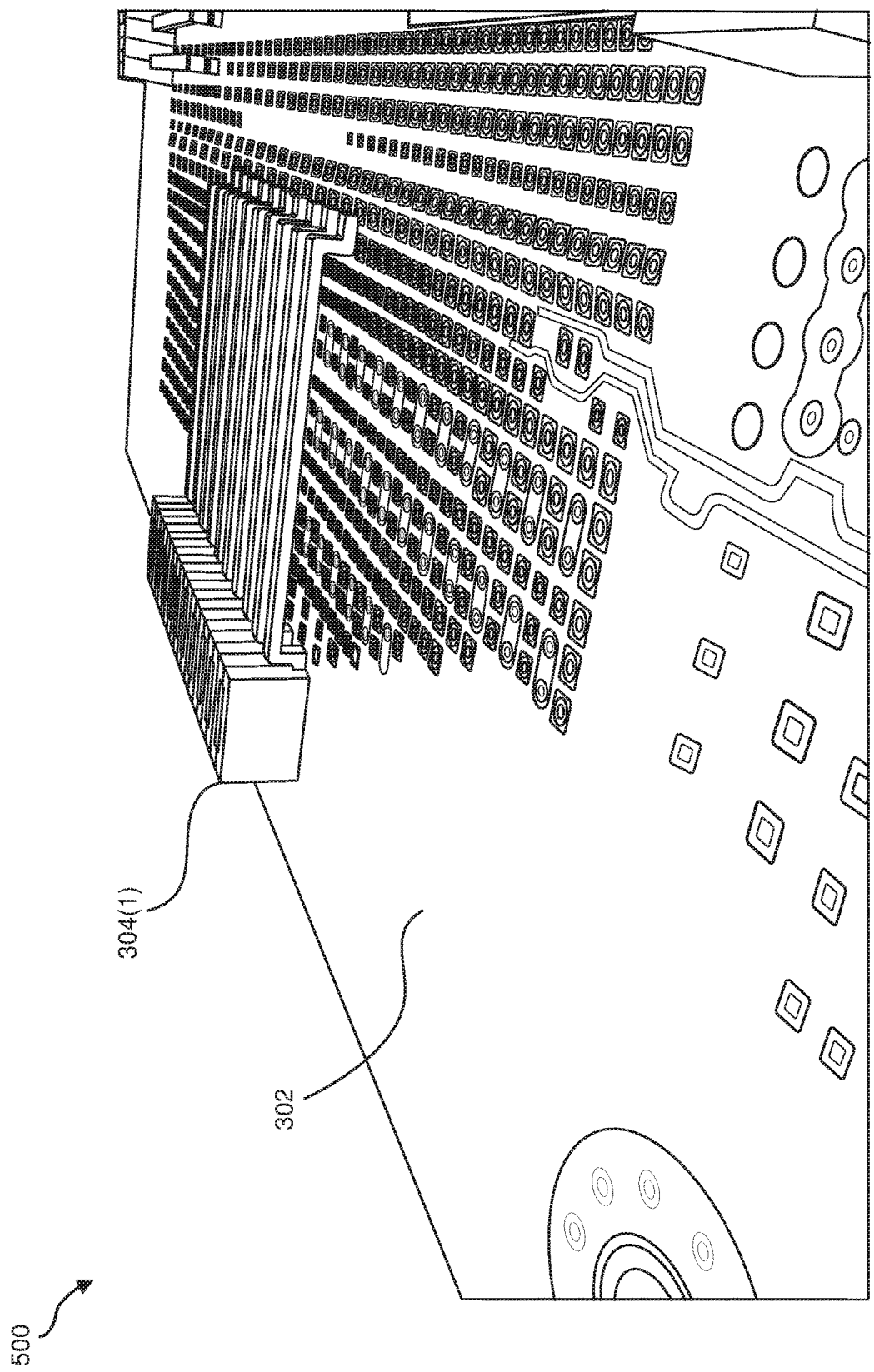
FIG. 5 is an illustration of an additional exemplary system that facilitates increased current distribution on high-density circuit boards.

FIGS. 4 and 5 illustrate exemplary systems 400 and 500, respectively, for increased current distribution on high-density circuit boards. As illustrated in FIGS. 4 and 5, exemplary systems 400 and 500 may include and/or represent array of inductors 304(1) coupled to circuit board 302. In one example, by deploying and/or implementing array of inductors 304(1) in this way, systems 400 and 500 may provide and/or facilitate the carrying and/or delivery of enough current to power an ASIC via the flying leads of the individual inductors. In this example, array of inductors 304(1) may be formed and/or created by joining and/or adhering the magnetic cores of individual current inductors together by an adhesive.

Figure 6:
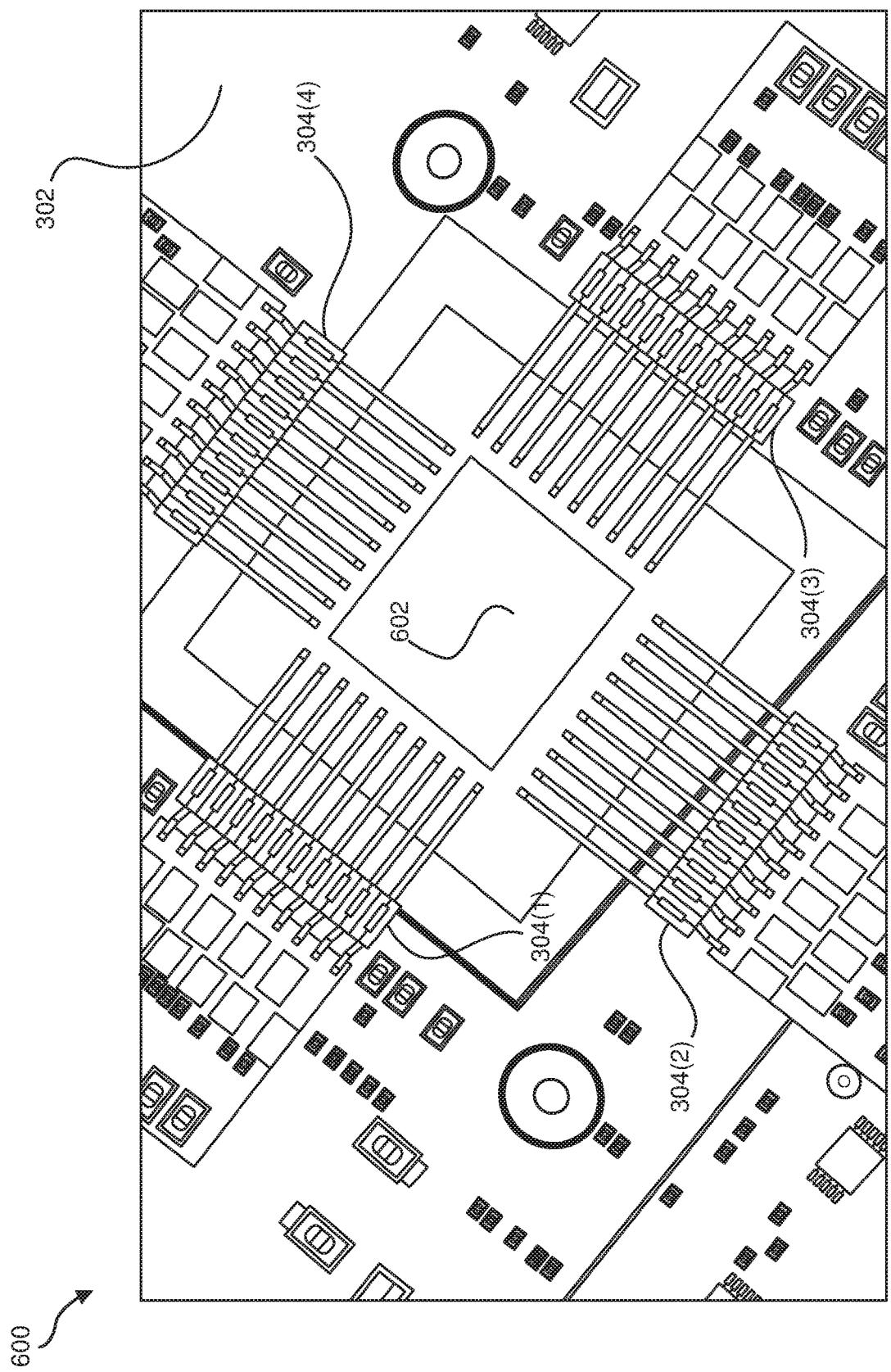
FIG. 6 is an illustration of an additional exemplary system that facilitates increased current distribution on high-density circuit boards.
Figure 7:
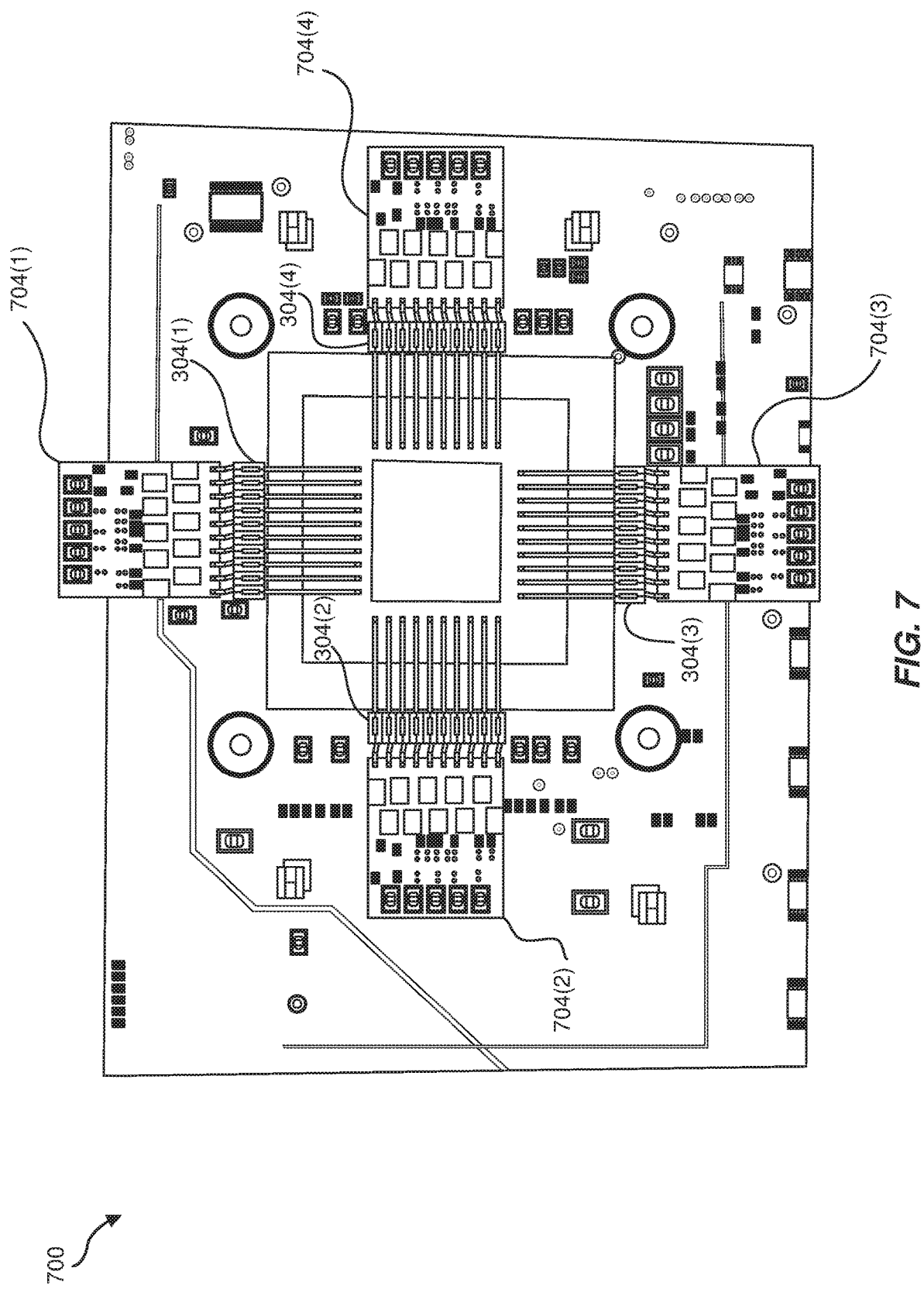
FIG. 7 is an illustration of an additional exemplary system that facilitates increased current distribution on high-density circuit boards.
Figure 8:
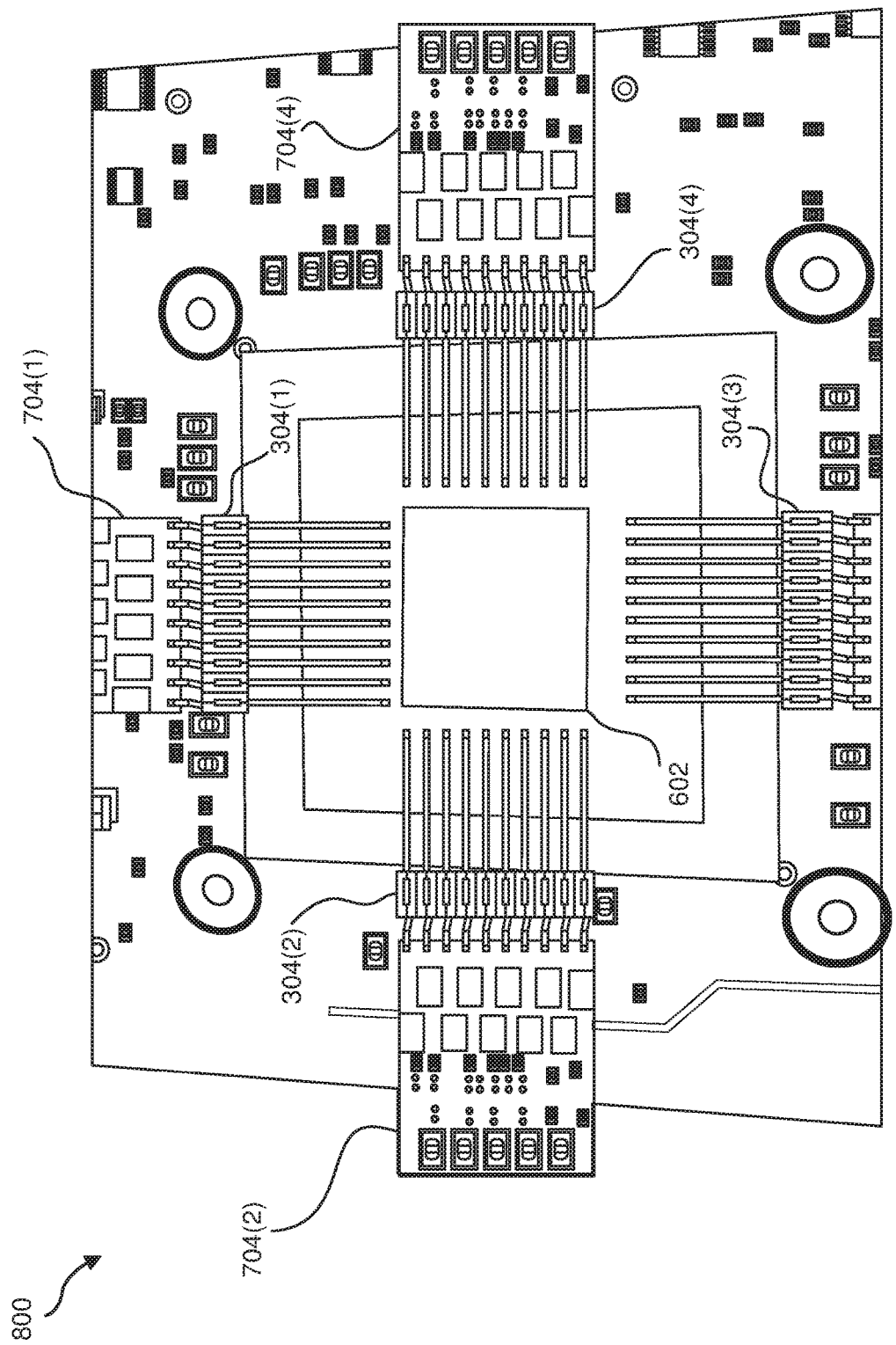
FIG. 8 is an illustration of an additional exemplary system that facilitates increased current distribution on high-density circuit boards.

FIGS. 6, 7, and 8 illustrate exemplary systems 600, 700, and 800, respectively, for increased current distribution on high-density circuit boards. As illustrated in FIGS. 6-8, exemplary systems 600, 700, and 800 may include and/or represent arrays of inductors 304(1)-(4) coupled to the top side of circuit board 302. In one example, by deploying and/or implementing array of inductors 304(1)-(4) in this way, systems 600, 700, and 800 may provide and/or facilitate the carrying and/or delivery of enough current to power an electrical component 602 via the flying leads of the individual inductors. In this example, systems 600, 700, and 800 may also include and/or represent a power source 704(1), a power source 704(2), a power source 704(3), and a power source 704(4). Each of power sources 704(1)-(4) in FIGS. 7 and 8 may include and/or represent a power supply that sources electric current to arrays of inductors 304(1)-(4).

In one example, power source 704(1) may be electrically coupled to array of inductors 304(1) to provide and/or deliver current to electrical component 602 via array of inductors 304(1). In this example, power source 704(2) may be electrically coupled to array of inductors 304(2) to provide and/or deliver current to electrical component 602 via array of inductors 304(2). Similarly, power source 704(3) may be electrically coupled to array of inductors 304(3) to provide and/or deliver current to electrical component 602 via array of inductors 304(3). Finally, power source 704(4) may be electrically coupled to array of inductors 304(4) to provide and/or deliver current to electrical component 602 via array of inductors 304(4).

In some examples, electrical component 602 may include and/or represent any type or form of component, device, and/or circuit that consumes electric power. Examples of electrical component 602 include, without limitation, ASICs, Systems on a Chip (SoCs), Central Processing Units (CPUs), microprocessors, microcontrollers, Field-Programmable Gate Arrays (FPGAs) that implement softcore processors, integrated circuits, portions of one or more of the same, variations or combinations of one or more of the same, and/or any other suitable electrical component.

Figure 9:
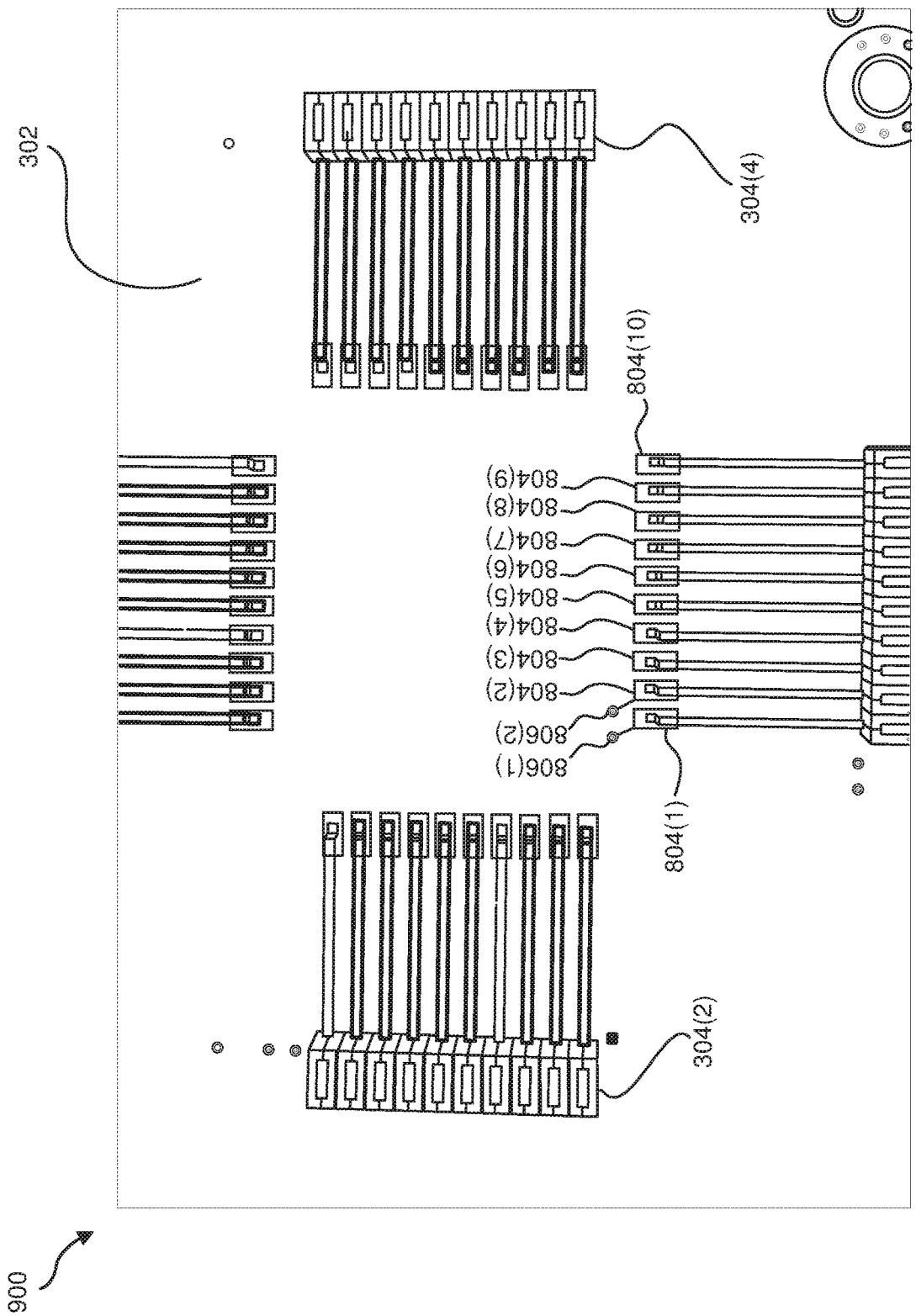
FIG. 9 is an illustration of an additional exemplary system that facilitates increased current distribution on high-density circuit boards.

FIG. 9 illustrates an exemplary system 900 for increased current distribution on high-density circuit boards. As illustrated in FIG. 9, exemplary system 900 may include and/or represent arrays of inductors 304(1)-(4) coupled to the bottom side of circuit board 302. In one example, exemplary system 900 may include and/or represent a solder pad 804(1), a solder pad 804(2), a solder pad 804(3), a solder pad 804(4), a solder pad 804(5), a solder pad 804(6), a solder pad 804(7), a solder pad 804(8), a solder pad 804(9), and a solder pad 804(10) incorporated into the bottom side of circuit board 302. The flying leads of the inductors included in array 304(3) may be electrically coupled to solder pads 804(1)-(10).

As illustrated in FIG. 9, solder pads 804(1) and 804(2) may be electrically coupled to electrical vias 806(1) and 806(2), respectively. Solder pads 804(3)-(10) may also be electrically coupled to other electrical vias (although not explicitly illustrated in FIG. 9). In one example, these electrical vias may carry and/or deliver electric current from the bottom side of circuit board 302 to the top side of circuit board 302. In this example, a power-consuming device (such as an ASIC) may be electrically coupled to the top side of circuit board 302. This power-consuming device may receive the electric current passed though the electric vias from the bottom side of circuit board 302.

Figure 10:
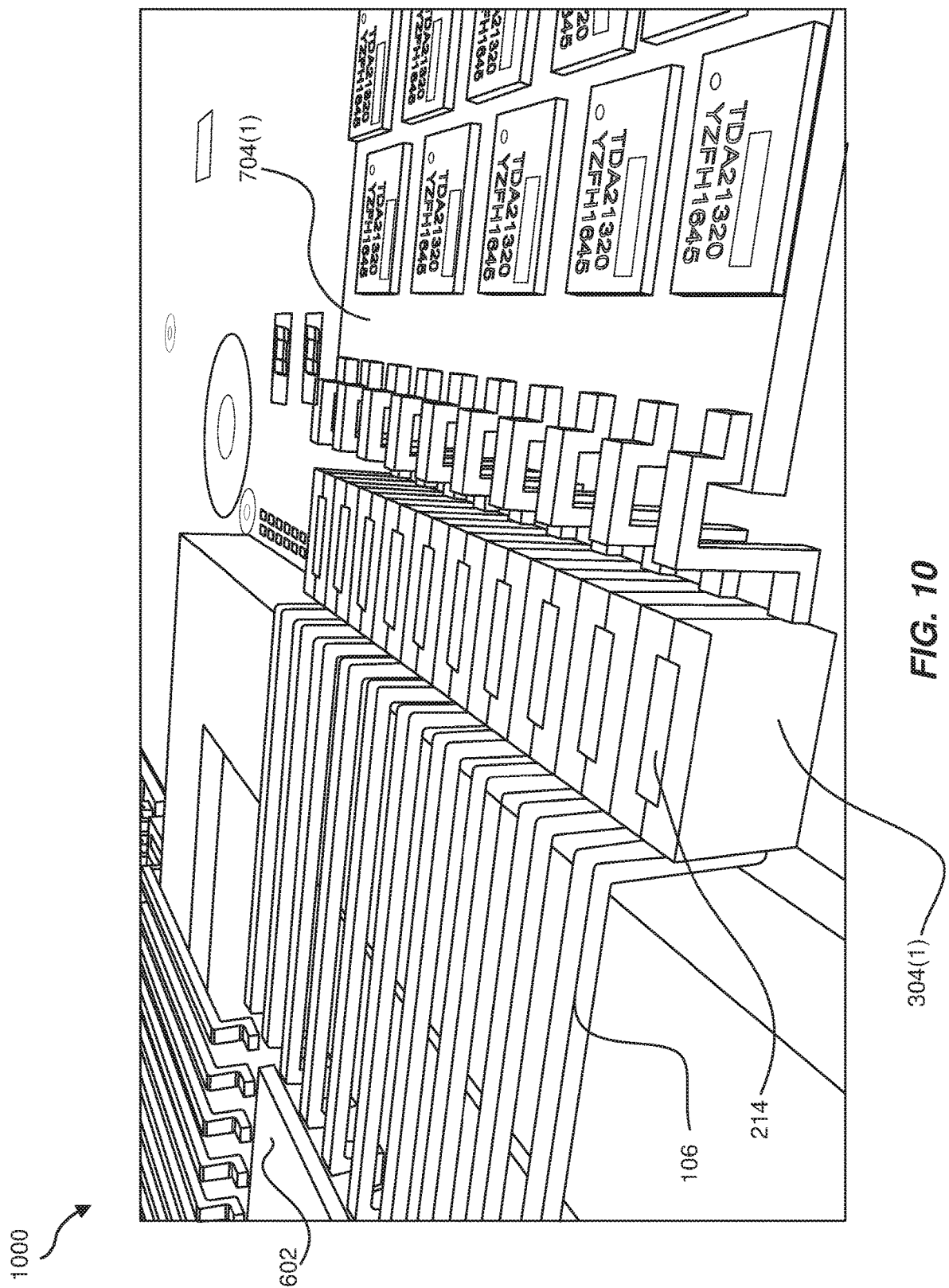
FIG. 10 is an illustration of an additional exemplary system that facilitates increased current distribution on high-density circuit boards.

FIG. 10 illustrates an exemplary system 1000 for increased current distribution on high-density circuit boards. As illustrated in FIG. 10, exemplary system 1000 may include and/or represent array of inductors 304(1) coupled to the top side of circuit board 302. In one example, by deploying and/or implementing array of inductors 304(1) in this way, system 1000 may provide and/or facilitate the carrying and/or delivery of enough current to power electrical component 602 via the flying leads of the individual inductors. In this example, system 1000 may also include and/or represent power source 704(1) that supplies and/or provides electric current to electrical component 602 via array of inductors 304(1). Array of inductors 304(1) may be electrically coupled between electrical component 602 and power source 704(1).

Figure 11:
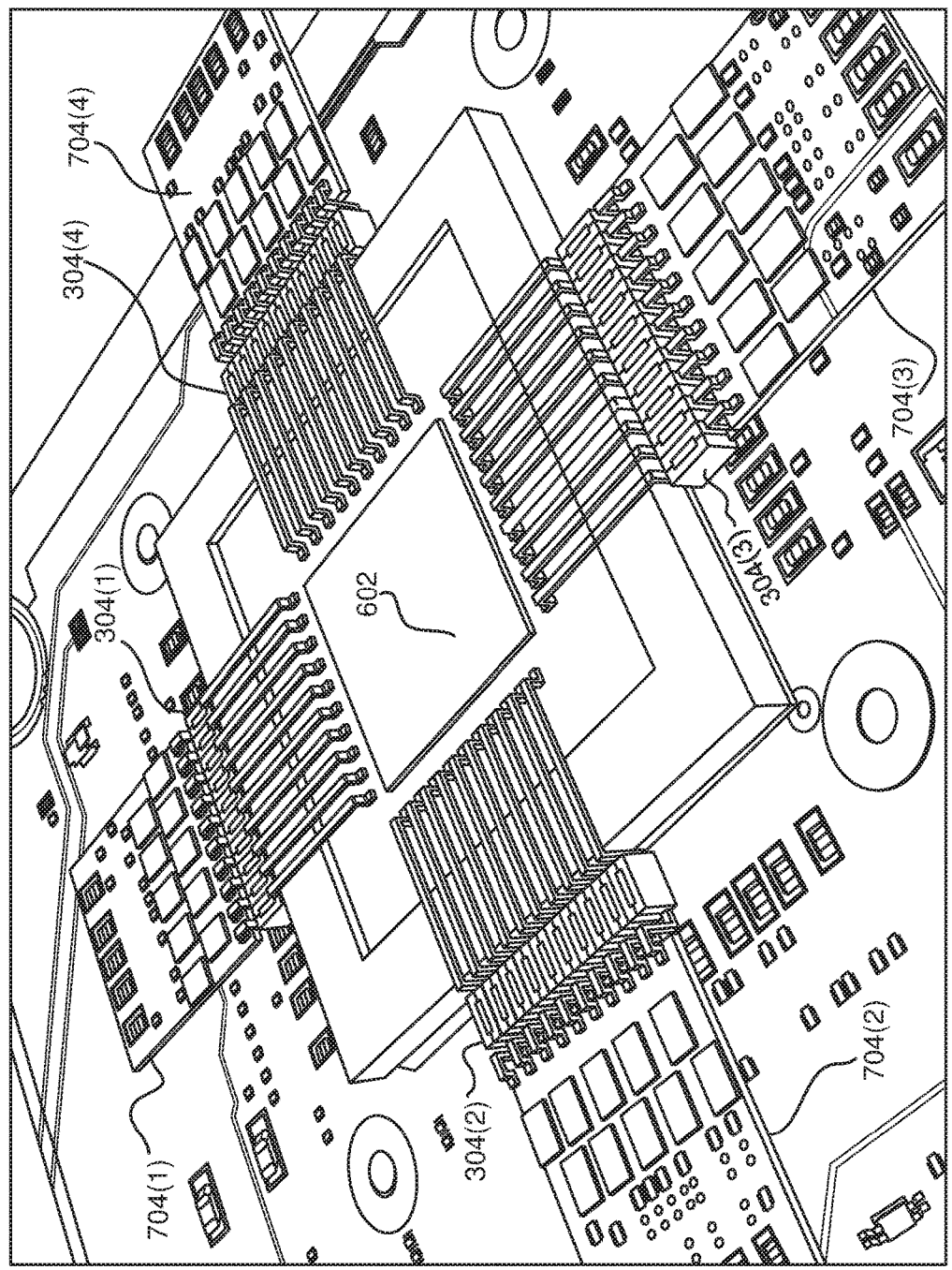
FIG. 11 is an illustration of an additional exemplary system that facilitates increased current distribution on high-density circuit boards.

FIG. 11 illustrate exemplary system 1100 for increased current distribution on high-density circuit boards. As illustrated in FIG. 11, exemplary system 1100 may include and/or represent arrays of inductors 304(1)-304(4) coupled to the top side of circuit board 302. In one example, by deploying and/or implementing arrays of inductors 304(1)-(4) in this way, system 1100 may provide and/or facilitate the carrying and/or delivery of enough current to power electrical component 602 via the flying leads of the individual inductors. In this example, system 1100 may also include and/or represent power source 704(1)-(4) electrically coupled to arrays of inductors 304(1)-(4). Each of power sources 704(1)-(4) in FIGS. 7 and 8 may include and/or represent a power supply that sources electric current to electrical component 602 via arrays of inductors 304(1)-(4).

Figure 12:
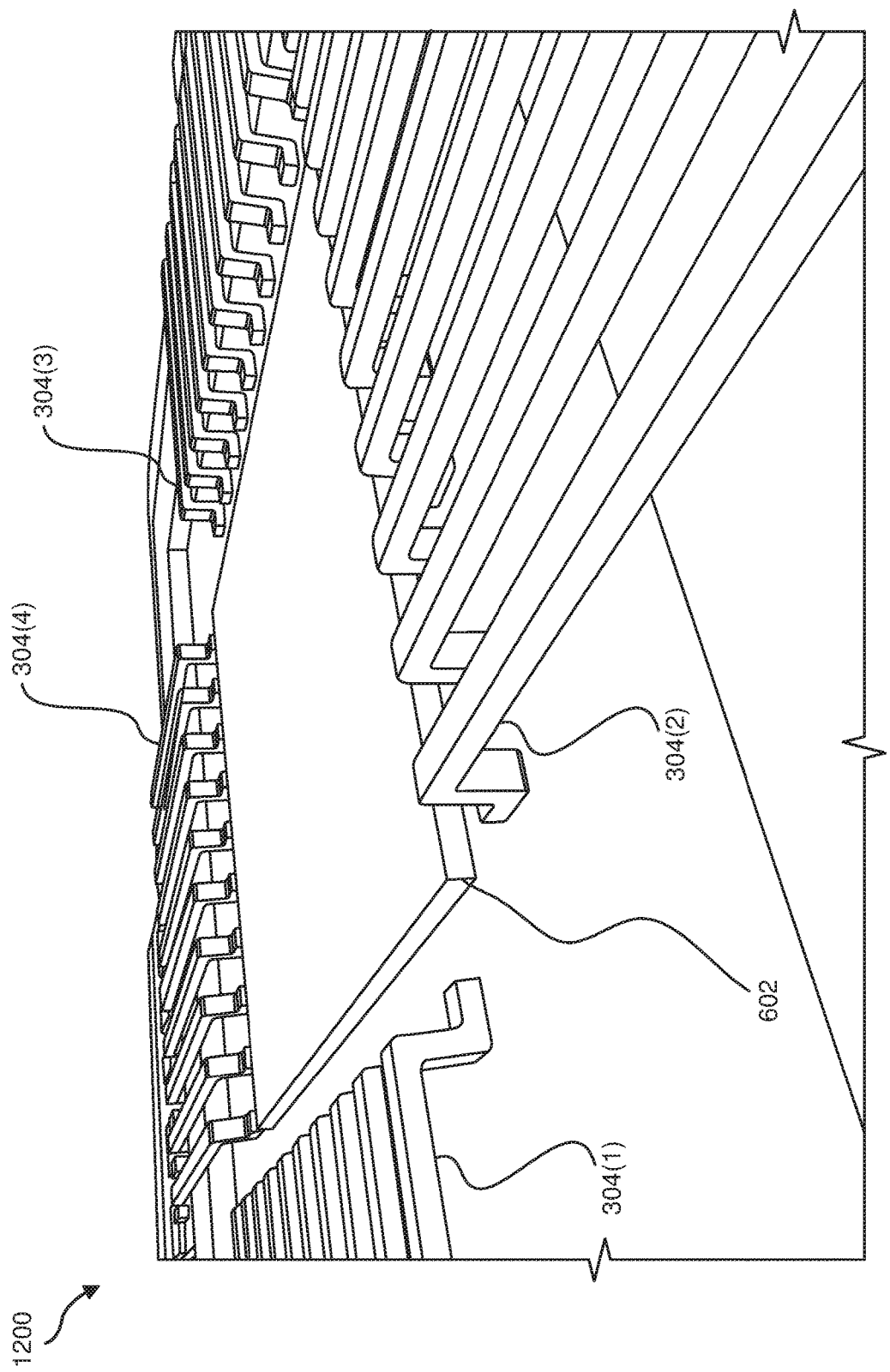
FIG. 12 is an illustration of an additional exemplary system that facilitates increased current distribution on high-density circuit boards.
Figure 13:
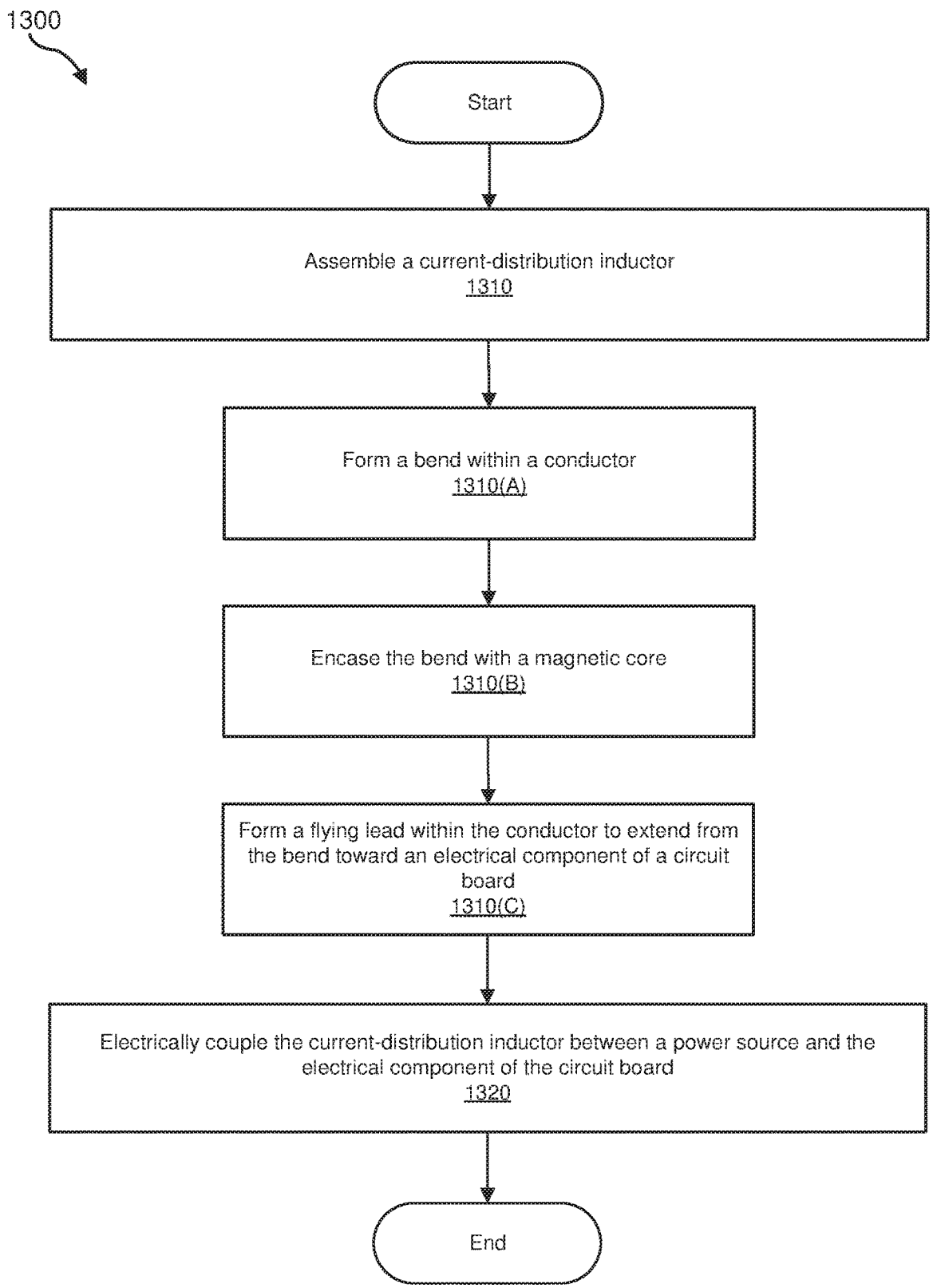
FIG. 13 is a flow diagram of an exemplary method for increased current distribution on high-density circuit boards.

FIG. 12 illustrate exemplary system 1200 for increased current distribution on high-density circuit boards. As illustrated in FIG. 12, exemplary system 1200 may include and/or represent arrays of inductors 304(1)-304(4) coupled to the top side of circuit board 302. In one example, by deploying and/or implementing arrays of inductors 304(1)-(4) in this way, system 1200 may provide and/or facilitate the carrying and/or delivery of enough current to power electrical component 602 via the flying leads of the individual inductors. In this example, system 1200 may also include and/or represent power source 704(1)-(4) electrically coupled to arrays of inductors 304(1)-(4). Each of power sources 704(1)-(4) in FIG. 12 may include and/or represent a power supply that sources electric current to electrical component 602 via arrays of inductors 304(1)-(4).

FIG. 1300 is a flow diagram of an exemplary method 1300 for increased current distribution on high-density circuit boards. Method 1300 may include the step of assembling a current-distribution inductor (1310). Step 1310 may be performed in a variety of ways, including any of those described above in connection with FIGS. 1-12. For example, a computing equipment manufacturer or subcontractor may assemble and/or manufacture a current-distribution inductor. In this example, the computing equipment manufacturer or subcontractor may form a bend within a conductor (1310(A)), encase the bend with a magnetic core (1310(B)), and form a flying lead within the conductor to extend from the bend toward an electrical component of a circuit board (1310(C)).

Method 1300 may also include the step of electrically coupling the current-distribution inductor between a power source and the electrical component of the circuit board such that a majority portion of the flying lead and the circuit board are parallel to one another (1320). Step 1320 may be performed in a variety of ways, including any of those described above in connection with FIGS. 1-12. For example, the computing equipment manufacturer or subcontractor may electrically couple the current-distribution inductor between a power source and the electrical component of the circuit board such that a majority portion of the flying lead and the circuit board are parallel to one another. In this example, the power source may supply and/or provide electric current to the electrical component via the current-distribution inductor.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. A current-distribution inductor comprising:
a magnetic core; and a conductor electrically coupled between a power source and an electrical component of a circuit board, wherein the conductor comprises:
  a bend that passes through the magnetic core; and
  a flying lead that extends from the bend to the electrical component of the circuit board, wherein:
    a majority portion of the flying lead runs parallel with the circuit board and is elevated from the circuit board; and
    the flying lead comprises a first bend formed between the majority portion of the flying lead and the bend that passes through the magnetic core, the first ben serving to elevate the flying lead from the circuit board.

2. The current-distribution inductor of claim 1, wherein the magnetic core comprises a plurality of magnetic segments that combine to at least partially encompass the bend of the conductor.

3. The current-distribution inductor of claim 2, wherein the magnetic segments are joined to one another by an adhesive.

4. The current-distribution inductor of claim 1, wherein the majority portion of the flying lead is not in physical contact with the circuit board.

5. The current-distribution inductor of claim 4, wherein the flying lead further comprises a second bend formed between the majority portion of the flying lead and the electrical component, the second bend serving to lower the flying lead to the circuit board.

6. The current-distribution inductor of claim 1, wherein the magnetic core comprises:
  a conductor entrance on a first side of the magnetic core;
  a conductor exit on a second side of the magnetic core that is opposite the first side; and
  an aperture on a top side of the magnetic core.

7. The current-distribution inductor of claim 6, wherein:
  a first portion of the bend enters the conductor entrance on the first side of the magnetic core;
  a second portion of the bend exits the conductor exit on the second side of the magnetic core; and
  a third portion of the bend that is exposed through the aperture on the top side of the magnetic core.

8. The current-distribution inductor of claim 6, wherein:
  the conductor entrance is located along a bottom corner of the first side of the magnetic core; and
  the conductor exit is located along a bottom corner of the second side of the magnetic core.

9. The current-distribution inductor of claim 1, wherein the electrical component of the circuit board comprises a conductive pad on a bottom side of the circuit board, the conductive pad is electrically coupled to a power-consuming device on a top side of the circuit board by an electrical via incorporated in the circuit board.

10. The current-distribution inductor of claim 1, further comprising:
  an additional magnetic core; and
  an additional conductor electrically coupled between the power source and an additional electrical component of the circuit board, wherein the additional conductor comprises:
    an additional bend that passes through the additional magnetic core; and
    an additional flying lead that extends from the additional bend to the additional electrical component of the circuit board and runs parallel with the circuit board.

11. The current-distribution inductor of claim 10, wherein the magnetic core and the additional magnetic core are joined to one another by an adhesive.

12. A system comprising:
  a circuit board that includes an electrical component; and
  a current-distribution inductor that includes:
    a magnetic core; and
    a conductor electrically coupled between a power source and the electrical component of the circuit board, wherein the conductor comprises:
      a bend that passes through the magnetic core; and
      a flying lead that extends from the bend to the electrical component of the circuit board, wherein:
        a majority portion of the flying lead runs parallel with the circuit board and is elevated from the circuit board; and
        the flying lead comprises a first bend formed between the majority portion of the flying lead and the bend that passes through the magnetic core, the first bend serving to elevate the flying lead from the circuit board.

13. The system of claim 12, wherein the magnetic core comprises a plurality of magnetic segments that combine to at least partially encompass the bend of the conductor.

14. The system of claim 13, wherein the magnetic segments are joined to one another by an adhesive.

15. The system of claim 12, wherein the majority portion of the flying lead is not in physical contact with the circuit board.

16. The system of claim 15, wherein the flying lead further comprises a second bend formed between the majority portion of the flying lead and the electrical component, the second bend serving to lower the majority portion of the flying lead to the circuit board.

17. The system of claim 12, wherein the magnetic core comprises:
  a conductor entrance on a first side of the magnetic core;
  a conductor exit on a second side of the magnetic core that is opposite the first side; and
  an aperture on a top side of the magnetic core.

18. A method comprising:
  assembling a current-distribution inductor by:
    forming a bend within a conductor;
    encasing the bend with a magnetic core; and
    forming a flying lead within the conductor to extend from the bend toward an electrical component of a circuit board; and
  electrically coupling the current-distribution inductor between a power source and the electrical component of the circuit board such that a majority portion of the flying lead and the circuit board are parallel to one another and the majority portion of the flying lead is elevated from the circuit board, wherein the flying lead comprises a first bend formed between the majority portion of the flying lead and the bend that passes through the magnetic core, the first bend serving to elevate the flying lead from the circuit board.

* * * * *